US010839898B2

(12) United States Patent
Indiveri et al.

(10) Patent No.: US 10,839,898 B2
(45) Date of Patent: Nov. 17, 2020

(54) DIFFERENTIAL MEMRISTIVE CIRCUIT

(71) Applicant: UNIVERSITÄT ZÜRICH, Zürich (CH)

(72) Inventors: Giacomo Indiveri, Zürich (CH); Manu Vijayagopalan Nair, Dübendorf (CH)

(73) Assignee: UNIVERSITÄT ZÜRICH, Zürich (CH)

( * ) Notice: Subject to any disclaimer, the term of this patent is extended or adjusted under 35 U.S.C. 154(b) by 0 days.

(21) Appl. No.: 16/634,148

(22) PCT Filed: Jul. 22, 2018

(86) PCT No.: PCT/EP2018/069852
§ 371 (c)(1),
(2) Date: Jan. 25, 2020

(87) PCT Pub. No.: WO2019/020537
PCT Pub. Date: Jan. 31, 2019

(65) Prior Publication Data
US 2020/0234762 A1 Jul. 23, 2020

(30) Foreign Application Priority Data

Jul. 27, 2017 (EP) .................................... 17183461

(51) Int. Cl.
*G11C 13/00* (2006.01)
(52) U.S. Cl.
CPC ........ *G11C 13/0007* (2013.01); *G11C 13/004* (2013.01); *G11C 13/0069* (2013.01);
(Continued)
(58) Field of Classification Search
CPC .............. G11C 13/0007; G11C 13/004; G11C 13/0069; G11C 2013/0042; G11C 2013/0073
See application file for complete search history.

(56) References Cited

U.S. PATENT DOCUMENTS 7,313,043 B2 * 12/2007 Gogl ........................ G11C 8/10
365/158
8,077,501 B2 * 12/2011 Ong .................... G11C 11/1673
365/158
(Continued)

FOREIGN PATENT DOCUMENTS

WO 2015/116144 A1 8/2015
WO 2016/064404 A1 4/2016

OTHER PUBLICATIONS

European Search Report dated Jan. 31, 2018 as received in Application No. 17183461.7.

*Primary Examiner* — Tri M Hoang
(74) *Attorney, Agent, or Firm* — Maschoff Brennan

(57) ABSTRACT

A differential memristive circuit includes a normaliser; a first memristor connected between first top and bottom nodes, the first memristive element having a first adjustable resistance value; a first switch connected between the first bottom node and the normaliser; a second memristor connected between a second top node and a second bottom node the second memristor having a second adjustable resistance value; a second switch connected between the second bottom node and the normaliser; and a set of voltage sources that generate voltages greater than 0V. The set of voltage sources generate a first voltage value across the first memristor and a second voltage value across the second memristor. A first output signal depends on the first adjustable resistance value, while a second output signal depends on the second adjustable resistance value. A memristive circuit net output signal is obtained as the difference between the first and second output signals.

15 Claims, 8 Drawing Sheets

(52) U.S. Cl.
CPC ............... *G11C 2013/0042* (2013.01); *G11C 2013/0073* (2013.01)

(56) References Cited

U.S. PATENT DOCUMENTS

| | | | |
|---|---|---|---|
| 8,964,458 B2 * | 2/2015 | Lin | ................ G11C 11/1673 |
| | | | 365/158 |
| 9,472,257 B2 * | 10/2016 | Dong | ................ H01L 43/12 |
| 9,646,684 B1 | 5/2017 | Calvetti et al. | |
| 2013/0201757 A1 | 8/2013 | Li et al. | |

\* cited by examiner

DIFFERENTIAL MEMRISTIVE CIRCUIT

TECHNICAL FIELD

The present invention relates to a differential memristive circuit, which may be used for instance in artificial neural networks. The invention also relates to a method of operating the circuit.

BACKGROUND OF THE INVENTION

Advancements in nano-electronics have led to creation of a new class of devices known as memristors. In spite of being envisioned decades ago, these devices have shown potential for sustaining electronics progress only recently, at a time when Moore's scaling law is coming to an end. A memristor is a non-linear passive two-terminal electrical component. A memristor is an electrical component which limits or regulates the flow of electrical current in a circuit and remembers the amount of charge that has previously flowed through it. Memristors are useful because they are non-volatile, i.e. they retain memory without power.

Since 2008, when the first memristive devices were fabricated, research efforts have mainly been focused towards addressing conventional memory and computing application needs. However, in recent years, memristive devices have also been investigated for implementing artificial neural network architectures and spike-based or event-based neuromorphic architectures. For example, it is known to use memristive devices as synapses and use spike-timing dependent plasticity (STDP) type mechanisms for programming the memory cell. In most of these designs, the update mechanism involves generation of overlapping pulses across the terminals of the memristive device such that the effective voltage difference across the targeted device exceeds the switching threshold. The voltage across the untargeted devices remains below the switching threshold and they remain unchanged. This mechanism is well-suited for STDP-based learning, but is not optimal for implementing learning based on other mechanisms such as gradient-descent. It has also been proposed to hold one of the terminals at a fixed direct current (DC) potential and the devices are programmed by applying a voltage pulse across the other terminal. This approach is more tractable for implementing gradient-descent based learning. Other solutions are also known. These solutions use gradient-descent based learning rules to program neural networks with memristive synapses.

Irrespective of the application, sensing and programming memristive devices in a manner that is fast and energy-efficient is useful for various use cases, ranging from conventional digital memories to hybrid analogue/digital neuromorphic synapses. Several methods have been proposed to sense the conductance of memristive devices. For example, it has been proposed to sense memristive devices by using circuits that control the voltage across its terminals with an operational amplifier feedback circuit. It has also been proposed a method to sense the device state by comparing its resistance with a reference resistive element, using a voltage amplifier in a feedback configuration. It is also known to use two voltage amplifiers to create a feedback circuit, which generates an output current, which is proportional to the current produced by the memristive device when both its terminals are clamped to controlled voltages.

The problem with the known memristive circuits is that they have a rather high memristive device conductance variability. Furthermore, at least some of the known solutions require a reference device or active elements (such as operational amplifiers) for sensing. Also, a high current consumption at the system level remains a problem for many known solutions and many solutions also have a small dynamic range.

SUMMARY OF THE INVENTION

The objective of the present invention is thus to overcome at least some of the above limitations relating to memristive circuits.

According to a first aspect of the invention, there is provided a memristive circuit as recited in claim 1.

Unlike previously proposed memristive circuits, the proposed circuit uses two memristive devices configured in a differential mode, to sense their input signals and to produce output signals, which may be scaled by a tunable scaling factor, and normalised by the sum of the two input signals. The differential mode of operation helps to reduce the variability of the output signals. It does not require a reference device or active elements (such as operational amplifiers) for sensing. The signal scaling and/or normalising features of the circuit reduce power consumption at the system level. Furthermore, the devices in the circuit can be programmed in a differential complementary mode, to reduce the effect of device variability. Together with the differential circuit arrangement this also helps to increase the circuit's overall dynamic range.

According to a second aspect of the invention, there is provided a memory cell comprising the memristive circuit.

According to a third aspect of the invention, there is provided a crossbar synaptic circuit comprising the memory cell.

According to a fourth aspect of the invention, there is provided a method of operating the memristive circuit according to the first aspect of the present invention.

Other aspects of the invention are recited in the dependent claims attached hereto.

BRIEF DESCRIPTION OF THE DRAWINGS

Other features and advantages of the invention will become apparent from the following description of a non-limiting example embodiment, with reference to the appended drawings, in which.

DETAILED DESCRIPTION OF AN EMBODIMENT OF THE INVENTION

Figure 1:
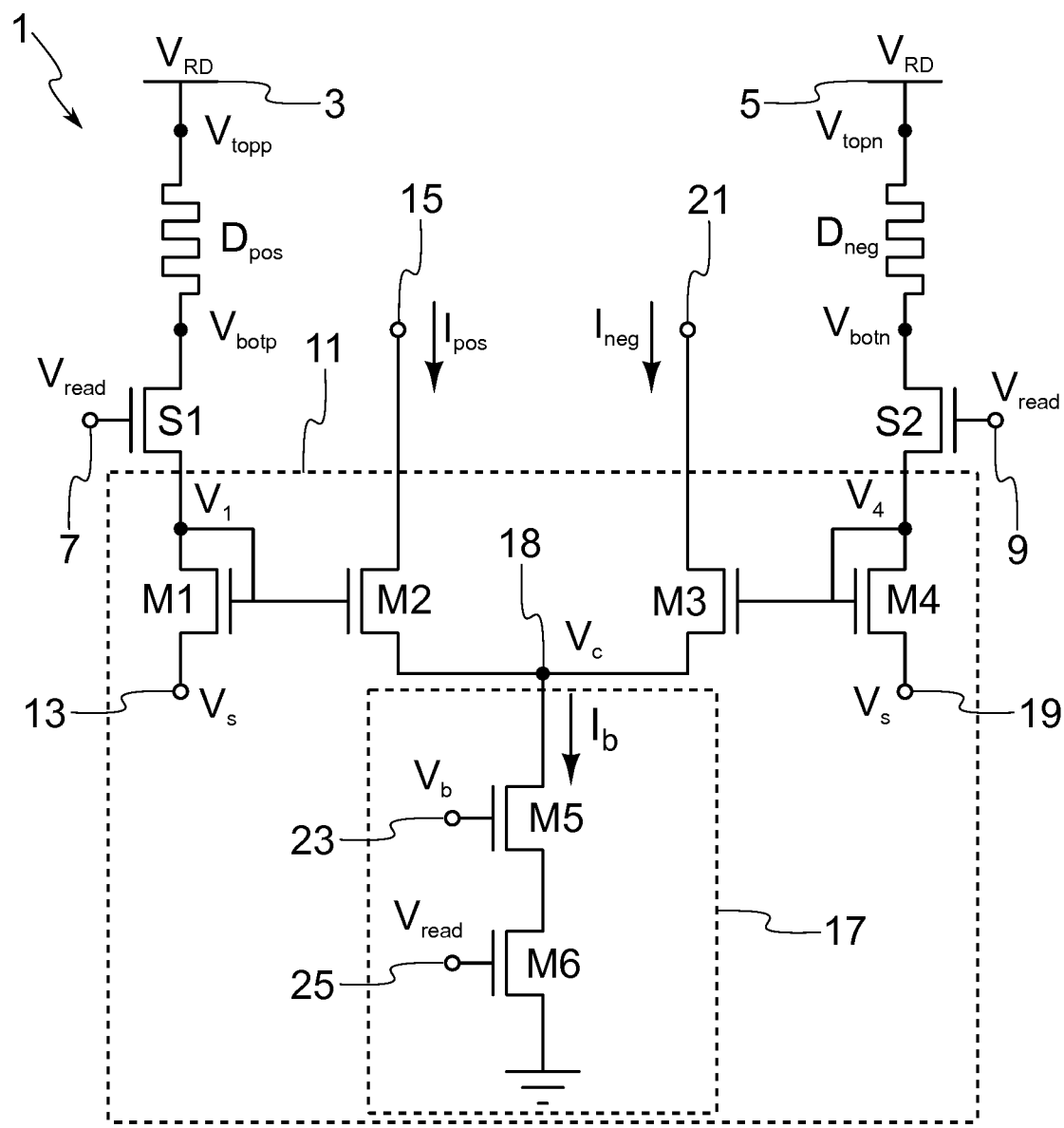
FIG. 1 is a schematic circuit diagram illustrating a read mode part of the memristive circuit according to an example of the present invention.

An embodiment of the present invention will now be described in detail with reference to the attached figures. Identical or corresponding functional and structural elements which appear in different drawings are assigned the same reference numerals.

The example embodiment of the present invention relates to a differential current-mode memristive circuit for measuring, sensing or reading the conductance (or resistance) of the memristive devices of the circuit, and for producing a scalable output current that is proportional to the sensed device conductances. In the present description, by a differential circuit is understood a circuit in which critical signals are represented by the difference or by another mathematical relationship of two signals rather than a single signal. Furthermore, because the circuit of the present embodiment is a current-mode circuit, these signals are currents. The proposed circuit can use one memristive device as a memory element and another one as a reference, or it can use two memristive devices as complementary memory elements in which memory update operations induce conductance changes in opposite directions in the memristive devices. The circuit is meant to operate in two distinct modes: a read mode operation is used for sensing the state of the memristive devices, whereas a write mode operation is used for changing their states. In read mode, the circuit produces scaled (with respect to the memristor input currents) normalised output currents that are approximately linearly dependent on the input current(s). It is then possible to determine the current through each of the memristive device. From the input currents, it is then possible to obtain the memristive device conductances, which reflect the states of the memristive devices. The proposed circuit is ideal for example for interfacing memristive devices to neuromorphic computing architectures using the differential memristive pair as synaptic elements of a spiking neural network. The embodiment explained below uses differential current-mode operation of the circuit, and generates a normalised scaled output current that is proportional to the input one.

FIG. 1 is a schematic diagram illustrating the read mode circuit part 1, which is based on the classical Gilbert normaliser circuit but uses in this example metal-oxide-semiconductor field-effect transistors (MOSFETs) operated in the sub-threshold region, and a first memristive device, referred to as a positive memristive device $D_{pos}$, and a second memristive device, referred to as a negative memristive device $D_{neg}$. The first memristive device $D_{pos}$ is connected between a first circuit node, referred to as a first top node or terminal $V_{topp}$ and a third circuit node, referred to as a first bottom node or terminal $V_{botp}$. The second memristive device $D_{neg}$ is connected between a second circuit node, referred to as a second top node $V_{topn}$ and a fourth circuit node, referred to as a second bottom node $V_{botn}$. The first top node $V_{topp}$ is connected to a first voltage source 3, referred to as a supply voltage source configured to produce a constant analogue voltage $V_{RD}$, while the second top node $V_{topn}$ is connected to a second voltage source 5, which in this example is configured to generate the voltage $V_{RD}$. The first bottom node $V_{botp}$ is connected to a first switch S1, while the second bottom node $V_{botn}$ is connected to a second switch S2. The first and second switches S1, S2 are in this example transistors, and more specifically MOSFETs. The first and second switches S1, S2 each have three nodes, namely drain, gate and source nodes. In this example, the drain nodes of the first and second switches S1, S2 are connected to the first bottom node $V_{botp}$ and the second bottom node $V_{botn}$, respectively. The gate nodes of the first and second switches S1, S2 are connected to a third voltage source 7 and to a fourth voltage source 9, respectively. The third and fourth voltage sources 7, 9 are configured to generate voltage levels referred to as $V_{read}$. In other words, when these voltage sources are enabled (by a series switch), a logical one is obtained, and once they are disabled, a logical zero is obtained as a result. The source nodes of the first and second switches S1, S2 are connected to a normaliser circuit 11.

In this example, the Gilbert normaliser circuit is used as the normaliser circuit 11. As is shown in FIG. 1, the normaliser circuit 11 comprises first, second, third, fourth, fifth and sixth normaliser transistors M1 to M6. All these transistors are in this example MOSFETS. The first normaliser transistor M1, and more specifically its drain node, is connected to the source node of the first switch S1. The source node of the first normaliser transistor M1 is connected to a fifth voltage source 13 configured to generate a constant analogue voltage referred to as $V_s$ so that $V_s>0$. The gate node of the first normaliser transistor M1 is connected to the second normaliser transistor M2, and more specifically to its gate node. The first normaliser transistor M1 is a diode connected transistor and together with the second normaliser transistor M2 forms a modified current mirror configuration or a scaling current mirror. However, it is to be noted that the first and second normaliser transistors M1, M2 do not form a traditional current mirror because the source node of the first normaliser transistor M1 is not connected to ground, i.e. the source nodes of the first and second normaliser transistors M1, M2 are not at the same voltage. The drain node of the second normaliser transistor M2 is connected to a first circuit output node 15, while the source node of the second normaliser transistor M2 is connected to a bias circuit 17 at a bias circuit input node 18. It is to be noted that the voltage at that node is denoted by $V_c$. Thus, the first and second normaliser transistors M1, M2 form a scaling current mirror, where the output current is scaled by a factor that is a function of the voltage $V_c$. It is further to be noted that active devices, such as transistors, should be properly biased to process a signal. In an analogue signal processing circuit, there are typically two fundamental parts: a signal processing part and a bias circuit. The signal processing part is devoted to elaborating the signal dynamic requirement, while the bias circuit is devoted to supplying currents and/or voltages to the signal processing part in order to allow it to properly operate.

The third and fourth normaliser transistors M3, M4 also form a modified current mirror configuration like the configuration of the first and second normaliser transistors M1, M2. The source node of the fourth transistor M4 is connected to a sixth voltage source 19 configures to generate a constant analogue voltage referred to as $V_s$ so that $V_s>0$. The drain node of the third normaliser transistor M3 is connected to a second circuit output node 21, while the source node of the third normaliser transistor M3 is connected to the bias circuit 17.

The bias circuit 17 comprises the fifth and sixth normaliser transistors M5, M6 connected in series. The drain node of the fifth normaliser transistor M5 is connected to the source nodes of the second and third normaliser transistors M2, M3. The gate node of the fifth normaliser transistor M5 is connected to a seventh voltage source 23, referred to as a bias voltage source and is configured to generate a bias voltage $V_b$, which is an analogue signal. More specifically, $V_b$ is a sub-threshold bias voltage that scales the circuit output currents. The source node of the fifth normaliser transistor M5 is connected to the drain node of the sixth normaliser transistor M6. The gate of the sixth normaliser transistor M6 is connected to an eighth voltage source 25 configured to generate the same voltage as the third and fourth voltage sources, namely $V_{read}$. In this example, the source of the sixth normaliser transistor M6 is grounded. The purpose of the normalisation operation carried out by the normaliser 11 is to rescale two input values x1 and x2 (i.e. the currents flowing through the memristive devices), whose magnitudes can vary by a large value, to a well-defined reference so that they can be sent as inputs to the following stage of computation that expect inputs to lie within a certain range. This can be accomplished by the following mathematical operation: x1_norm=x1/(x1+x2) *constant and x2_norm=x2/(x1+x2)*constant. In this manner scaled output signals can be produced. The normaliser accomplishes this for two or more input current sources.

When the memristive devices $D_{pos}$ and $D_{neg}$ are connected to the supply voltage $V_{RD}$, the circuit 1 is in its read mode operational state. In this mode of operation, the current flowing through the memristive devices $D_{pos}$, $D_{neg}$ can be determined at their respective top nodes $V_{topp}$, $V_{topn}$ and a normalised version of that current is produced at the circuit outputs 15, 21, whenever the $V_{read}$ signal is enabled. A differential current-mode readout circuit that computes $I_{pos}-I_{neg}$ as a net output signal can double the resolution of the conductance/memory state sensing operation. It is to be noted that in the example described above, all the transistors of the read mode circuit part 1 are n-channel MOSFETs. However, it would be possible to implement all the above transistors as p-channel MOSFETs instead. The input current sensing operation is explained next in more detail. It is further to be noted that instead of operating the circuit in current mode, it could be operated in voltage mode. More specifically, by adding a load, such as a resistor or a transistor, to the circuit output nodes 15, 21, the output from the circuit would be voltages instead of currents. Therefore, the circuit can be used either in voltage mode or current mode. In the present description, circuits where signals are represented as voltages are voltage-mode circuits and those where signals are represented as currents are current-mode circuits.

When $V_{read}$ is high (i.e. $V_{read}$ is enabled), the current through the memristive device $D_{pos}$, $D_{neg}$ flows also through its attached diode-connected transistor M1, M4. Specifically:

$$I_{Dpos}=I_{M1} \text{ and}$$

$$I_{Dneg}=I_{M4}, \quad (1)$$

where $I_{Dx}$ is the current through the device $D_x$ and $I_{Mi}$ is the current through the transistor Mi.

For low-power operations, it is desirable to have very small currents flowing through the memristive devices $D_{pos}$, $D_{neg}$. It is to be noted that the magnitude of these currents can be reduced by raising the voltage $V_s$. If this condition is fulfilled, an approximation can be made that allows us to derive analytically the relationship between the circuit parameters, and the current flowing through the circuit external branches (i.e. the branches comprising the memristive devices). By writing the device equations and equating the currents through the devices, it is obtained:

$$(V_{RD} - V_i) = R_x I_x \quad (2)$$

$$I_{Mi} = I_0 e^{\frac{-\kappa V_i - V_s}{U_T}}$$

$$I_x = I_{Mi},$$

where $R_x$ represents the resistance of the memristive device $D_x$, $V_{RD}$ the supply voltage provided in read mode, $V_s$ the source voltage of the transistors M1 and M4, $V_i$ the gate voltage of the transistor Mi, $\kappa$ the sub-threshold slope factor, and $U_T$ the thermal voltage. By solving for $V_i$:

$$I_x = I_0 e^{\frac{-\kappa R_x I_x}{U_T}} e^{\frac{\kappa V_{RD} V_s}{U_T}}, \quad (3)$$

where $I_0$ the transistor leakage current. If $I_x$ is sufficiently small, then $$I_0 e^{\frac{-\kappa R_x I_x}{U_T}} \approx I_0 \left(1 - \frac{\kappa}{U_T} R_x I_x\right). \quad (4)$$

Then:

$$I_x = I_{Mi} = I_0 \frac{1}{e^{-\frac{\kappa V_{RD}-V_s}{U_T}} + \frac{\kappa}{U_T} R_x I_0}. \quad (5)$$

Figure 2:
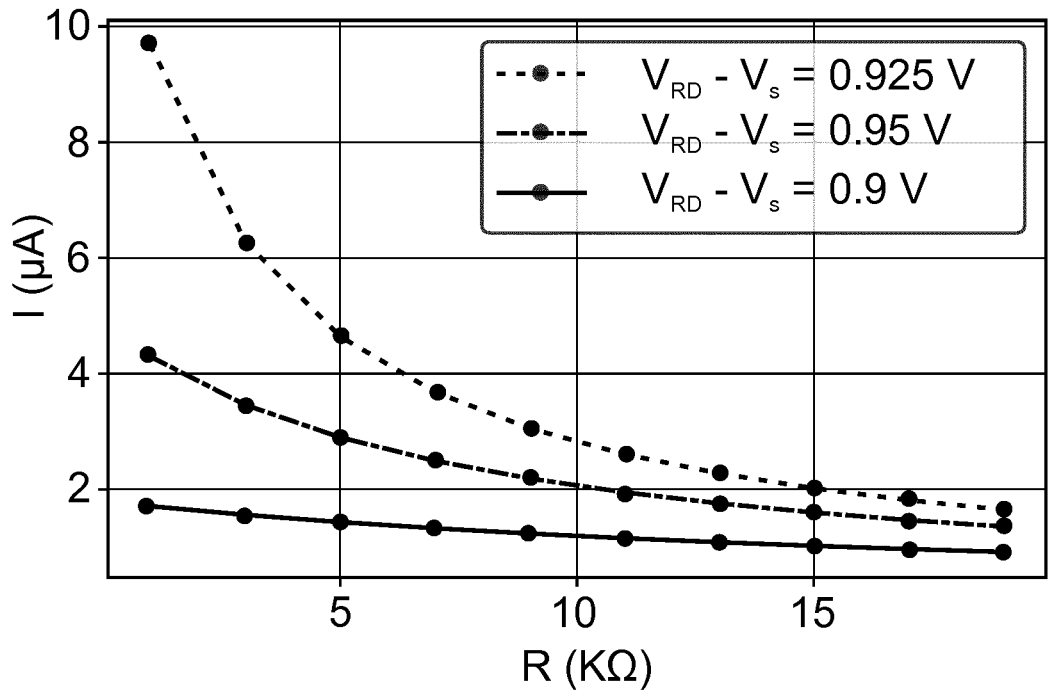
FIG. 2 is a diagram illustrating a theoretical input current of the circuit of FIG. 1 as a function of memristive device resistance for three different voltage settings according to an example of the present invention.

Equation 5 describes how the circuit input current changes with the resistance or conductance of the memristive device, and with the $V_{RD}$ and $V_s$ voltages. In particular, for large $V_{RD}-V_s$ values, the current is approximately linear with the memristive device conductance, but assumes relatively large values (large values make circuit less power-efficient). For very small $V_{RD}-V_s$ values, the circuit produces very small currents that change linearly, but with a very small dependence on the device memristance $R_x$. The effect of this trade-off is highlighted in FIG. 2, which plots Equation 5 for different values of $V_s$, with $V_{RD}$ set to 1.8 V. The output current normalisation operation is explained next.

The differential memristive circuit 1 has two output currents $I_{pos}$, $I_{neg}$, which are directly proportional to the input currents sensed from the corresponding input branches and scaled by the bias current $I_b$. More specifically, if all transistors operate in saturation, and in sub-threshold:

$$I_{M1} = I_0 e^{\frac{\kappa}{U_T} V_1} e^{-\frac{V_s}{U_T}} \quad (6)$$

$$I_{pos} = I_0 e^{\frac{\kappa}{U_T} V_1} e^{-\frac{V_c}{U_T}}$$

-continued $$I_{M4} = I_0 e^{\frac{\kappa}{U_T} V_4} e^{-\frac{V_s}{U_T}}$$

$$I_{neg} = I_0 e^{\frac{\kappa}{U_T} V_4} e^{-\frac{V_c}{U_T}}.$$

By solving for $$e^{-\frac{V_c}{U_T}}$$

using the extra condition that $I_b = I_{pos} + I_{neg}$, and replacing terms in Equation 6, it is obtained:

$$I_{pos} = I_b \frac{I_{M1}}{I_{M1} + I_{M4}} \quad (7)$$

$$I_{neg} = I_b \frac{I_{M4}}{I_{M1} + I_{M4}}.$$

This makes it possible to produce the output currents $I_{pos}$, $I_{neg}$, which are approximately linearly dependent on the currents flowing through the memristive devices $D_{pos}$, $D_{neg}$, and potentially much smaller, thus enabling the design of ultra-low-power current-mode memristive sensing architectures. In order to ensure proper operation of the differential memristive output normalising behaviour, while minimising the power dissipated in the input current sensing stage, it is beneficial to have large $V_s$ values, with small $V_{RD} - V_s$ values. The independent $V_s$ setting (which would otherwise be connected to ground by default) is one aspect of the present invention.

Figure 3:
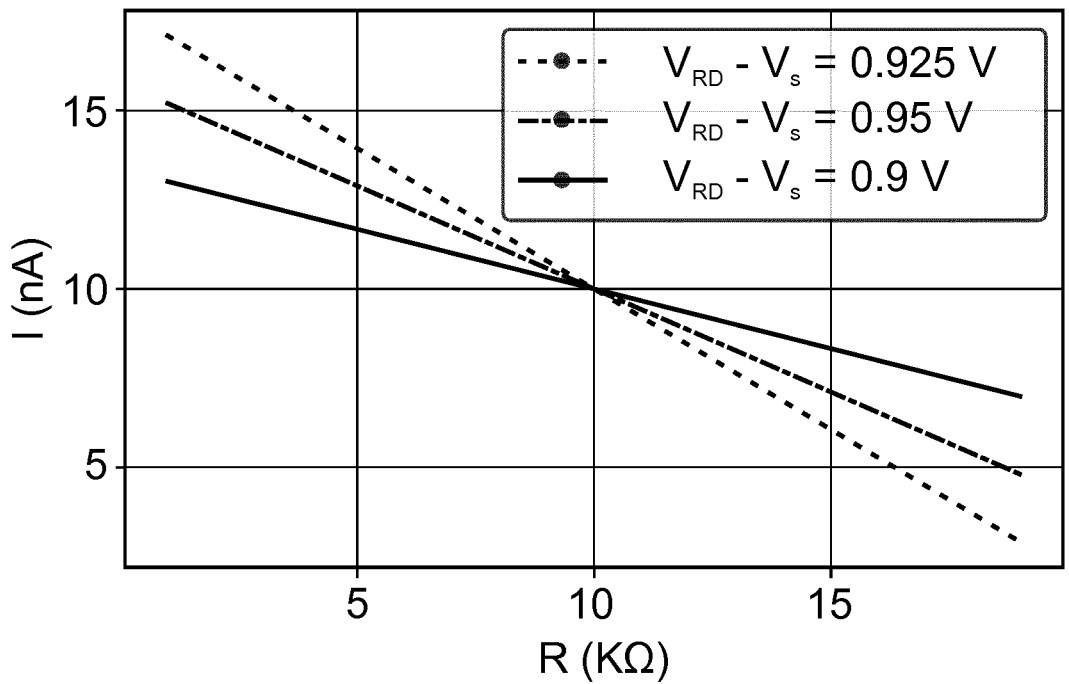
FIG. 3 is a diagram illustrating a theoretical output current of the circuit of FIG. 1 as a function of memristive device resistance for three different voltage settings according to an example of the present invention.

FIG. 3 shows the theoretical normalised output current $I_{pos}$, for a bias current $I_b = 20$ nA, for resistance values of $D_{pos}$ increasing from 1 KΩ to 20 KΩ, and for resistance values of $D_{neg}$ decreasing proportionally from 20 KΩ to 1 KΩ.

Figure 4:
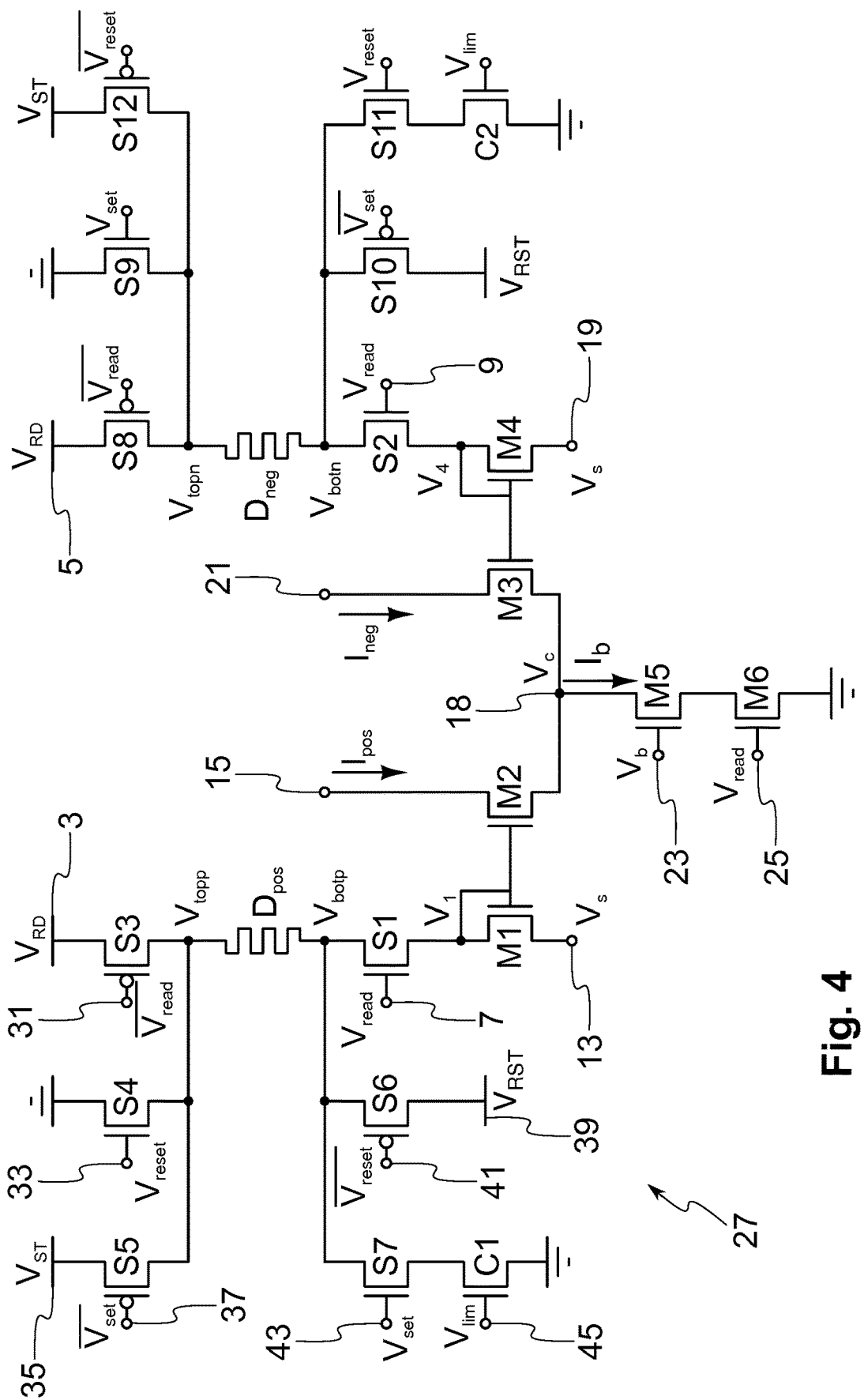
FIG. 4 is a schematic circuit diagram illustrating a complete memristive circuit according to an example of the present invention.

The circuit diagram of FIG. 4 illustrates the complete memristive circuit 27 comprising the read mode part 1, but also a write mode part. As is shown in FIG. 4, the write mode part comprises a set of switches and a set of voltage sources. The write mode part can be divided into a first write mode circuit sub-portion connected to the left external read mode circuit branch, and a second write mode circuit sub-portion connected to the right external read mode circuit branch. The first write mode circuit sub-portion comprises a third switch S3, a fourth switch S4, fifth switch S5, a sixth switch S6 and a seventh switch S7. All these switches are in this example transistors, and more specifically MOSFETs. Furthermore, in this example, the fourth and seventh switches S4, S7 are n-channel MOSFETs, while the third, fifth and sixth switches S3, S5, S7 are p-channel MOSFETs. In this manner, the write mode switches can be implemented in complementary metal-oxide-semiconductor (CMOS) logic. The third switch S3 is connected between the first voltage source 3 and the first top node $V_{topp}$. The gate node of the third switch S3 is connected to a ninth voltage source 31 configured to generate a voltage referred to as $\overline{V_{read}}$. It is to be noted that signals with an overline, such as $\overline{X}$ represent an inverted version of the original signal X. For example, if the value of the original signal X is a logical one, then the value of the inverted signal $\overline{X}$ would be a logical zero, or vice versa. The fourth switch S4 is arranged parallel with the third switch S3 but so that the source of the fourth switch S4 is grounded. The gate of the fourth switch S4 is connected to a tenth voltage source 33 configured to generate a voltage referred to as $V_{reset}$. The fifth switch S5 is arranged parallel with the third and fourth switches S3, S4 but so that the drain of the fifth switch S5 is connected to an 11th voltage source 35 configured to generate a voltage referred to as $V_{set}$, which is a constant analogue voltage. The gate of the fifth switch S5 is connected to a $12^{th}$ voltage source 37 configured to generate a voltage referred to as $\overline{V_{set}}$.

The sixth switch S6 is arranged parallel with the first switch S1 so that the source of the sixth switch S6 is connected to a $13^{th}$ voltage source 39 configured the generate a voltage $V_{RST}$, which is a constant analogue voltage. The gate of the sixth switch S6 is connected to a $14^{th}$ voltage source 41 configured to generate a voltage referred to as $\overline{V_{reset}}$. The seventh switch S7 is arranged parallel with the first and sixth switches S1, S6. The gate of the seventh switch S7 is connected to a $15^{th}$ voltage source 43 configured to generate a voltage referred to as $V_{set}$. The source node of the seventh switch S7 is connected to a first current limiting transistor C1. The gate of the first current limiting transistor C1 is connected to a $16^{th}$ voltage source 45 configured to generate a voltage referred to as $V_{lim}$. The source node of the first current limiting transistor C1 is grounded. The purpose of the first current limiting transistor C1 is to protect the first memristive device $D_{pos}$ from damage during programming (write mode operation). The signal $V_{lim}$ is a current limiting bias voltage chosen to ensure that the first memristive device $D_{pos}$ is not damaged during the write mode operation.

The second write mode circuit sub-portion is very similar to the first write mode circuit sub-portion and for this reason no detailed description of the second write mode circuit sub-portion is given here. As can be seen, the second write mode circuit sub-portion comprises eight, ninth, tenth, $11^{th}$ and $12^{th}$ switches S8, S9, S10, S11, S12. Their gate nodes are connected to a set of voltage sources as shown in FIG. 4. However, compared to the first write mode circuit sub-portion, in the second write mode circuit sub-portion, the following changes have been made: $\overline{V_{reset}} \to \overline{V_{set}}$, $V_{set} \to V_{reset}$, $V_{reset} \to V_{set}$ and $\overline{V_{set}} \to \overline{V_{reset}}$. The second write mode circuit sub-portion also comprises a second current limiting transistor C2 whose purpose is to protect the second memristive device $D_{neg}$ from damage during the write mode operation. The constant analogue voltage sources in the second write mode circuit sub-portion are configured to generate the same voltage values as the corresponding constant analogue voltage sources in the first write mode circuit sub-portion. It is to be noted that all the switches of the write mode part are controlled (at their gate nodes) by binary control signals (voltages). The write mode operation, which takes place immediately after the read mode operation, is explained next in more detail.

The proposed memristive circuit 27 can best exploit its features if in the write mode operation, the states of the memristive devices $D_{pos}$, $D_{neg}$ are updated in a complementary way. For example, if one device is driven to increase its conductance, the complementary device should be driven to decrease it, or vice versa. To separate the read mode and write mode operations, the set of switches was introduced as explained above. These switches can selectively connect the top and bottom nodes $V_{topx}$, $V_{botx}$ of the memristive devices to either the read or write mode circuits. The method for achieving this behaviour is explained next.

In read mode, the switches S1, S2, S3, and S8 are turned on, while all the other switching transistors S4-S7, S9-S12 are off. When a transistor is said to be off, it does not conduct current through it. In other words, the circuit path between the drain node and the source node is not conductive. In the read mode, the digital control signal $V_{read}$ is set to logical one, and both $V_{set}$ and $V_{reset}$ are set to logical zero. In this mode of operation, the first and second memristive devices $D_{pos}$, $D_{neg}$ are connected through the third and eight switches S3, S8 to the supply voltage $V_{RD}$. As mentioned, the normaliser transistors M1-M6 implement the current-mode normaliser circuit 11.

Figure 5:
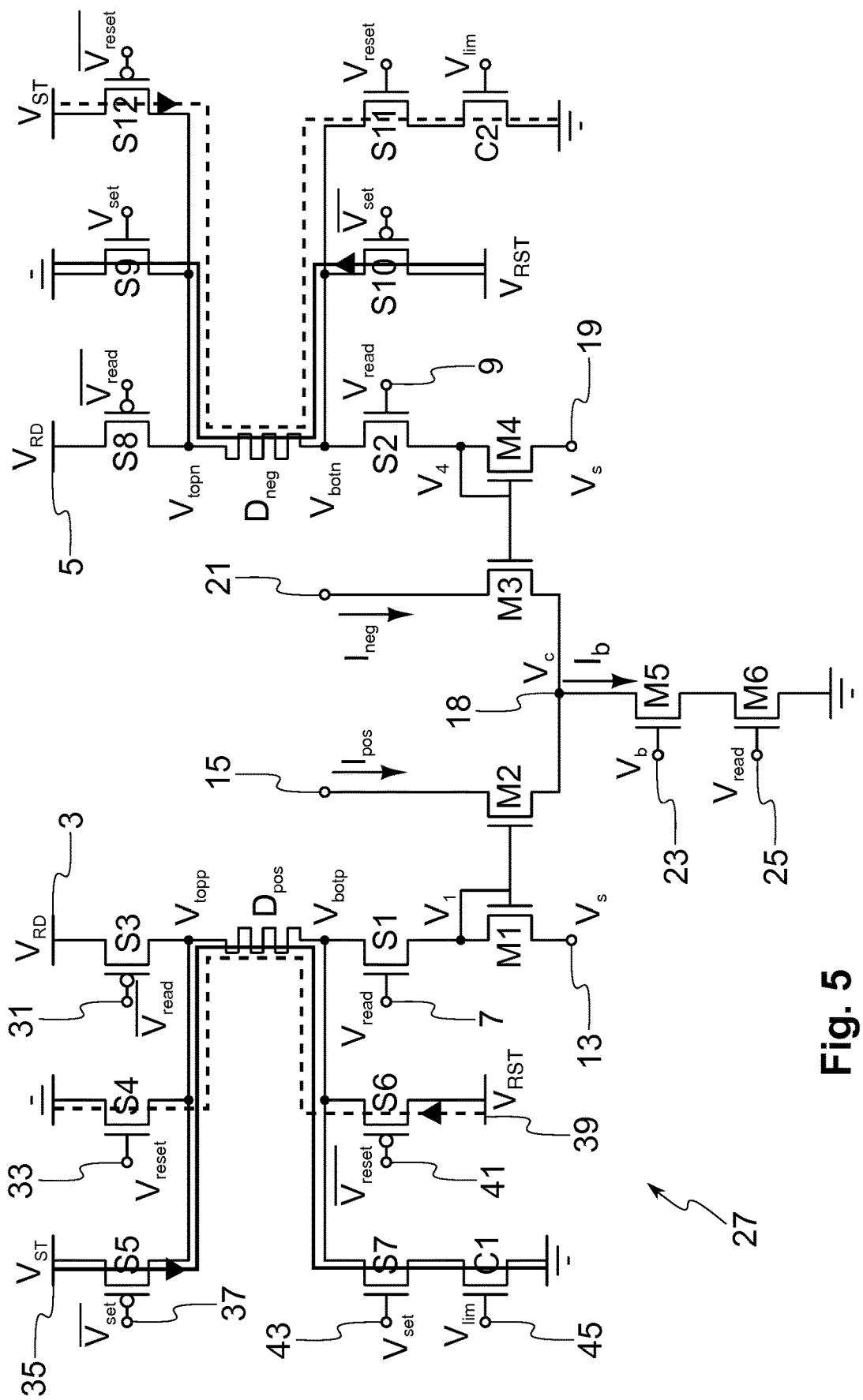
FIG. 5 is a schematic circuit diagram illustrating the circuit of FIG. 4 but further showing how various currents may be configured to flow in the circuit to adjust memristive device resistances.

During the write mode operation, in this example, the switching transistors are turned on such that the resulting voltage across the memristive devices $D_{pos}$, $D_{neg}$ induce opposite changes in their conductances. For example, to increase the net output current ($I_{pos}-I_{neg}$), the conductance of $D_{pos}$ is increased and that of $D_{neg}$ is decreased. This is done by enabling (turning on) the switches S5, S7, S9, and S10 by programming the $V_{set}$ signal to logical one and both $V_{read}$ and $V_{reset}$ signals to logical zero. This connects the $V_{topp}$ node to $V_{ST}$, $V_{botp}$ to the drain of C1, $V_{botn}$ to $V_{RST}$, and $V_{topn}$ to ground. FIG. 5 illustrates the path and direction of the SET current (solid line) in the circuit 27. Similarly, to decrease the circuit net output current ($I_{pos}-I_{neg}$), $V_{reset}$ is to set logical one, and both $V_{read}$ and $V_{set}$ are set to logical zero. FIG. 5 illustrates with a dashed line how the RESET current would flow in the circuit 27 in this case. To minimise power consumption, all the switches and select signals are activated only during a read or write event.

Figure 6:
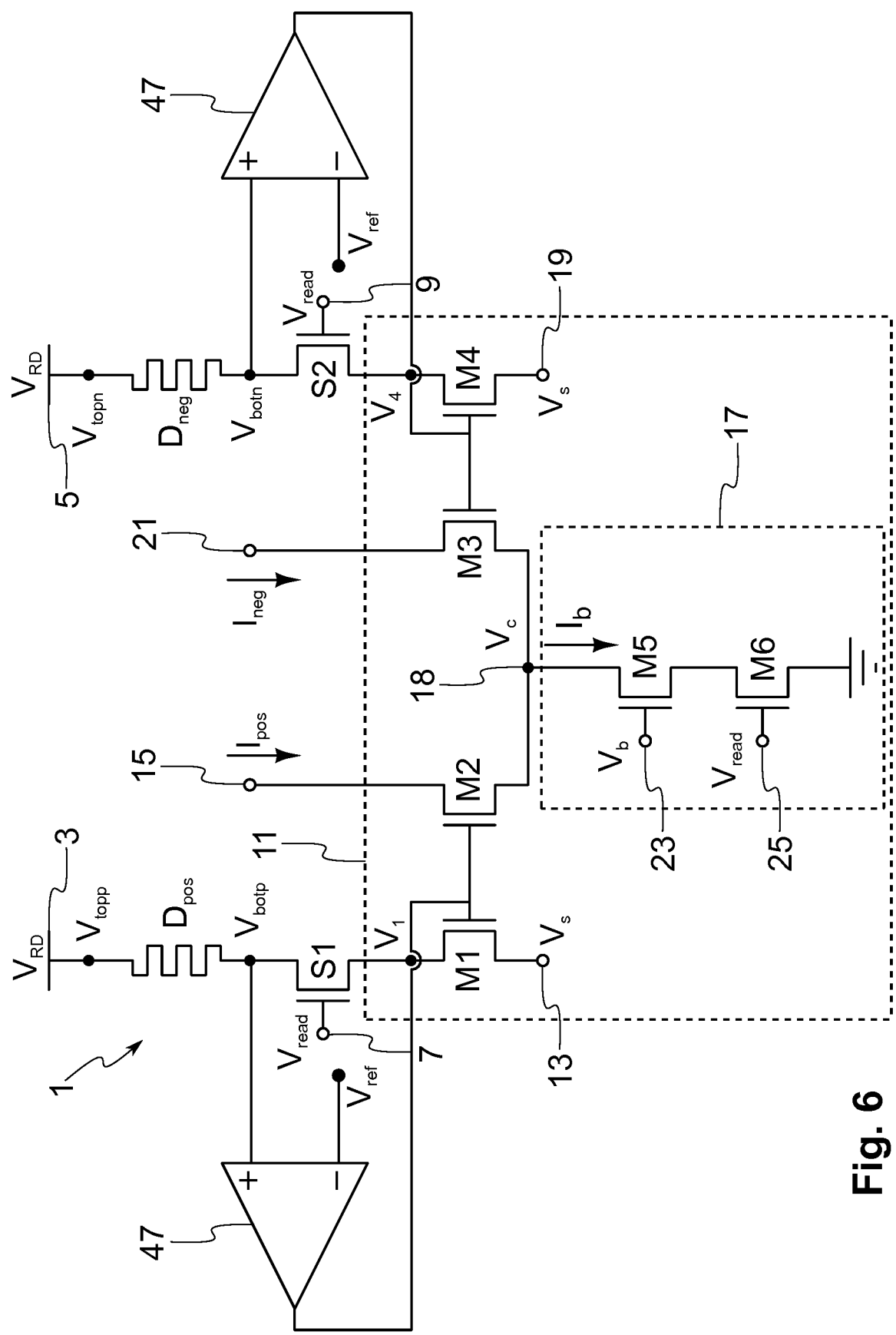
FIG. 6 is a schematic circuit diagram illustrating a first variant of the read mode part of the memristive circuit according to an example of the present invention.
Figure 7:
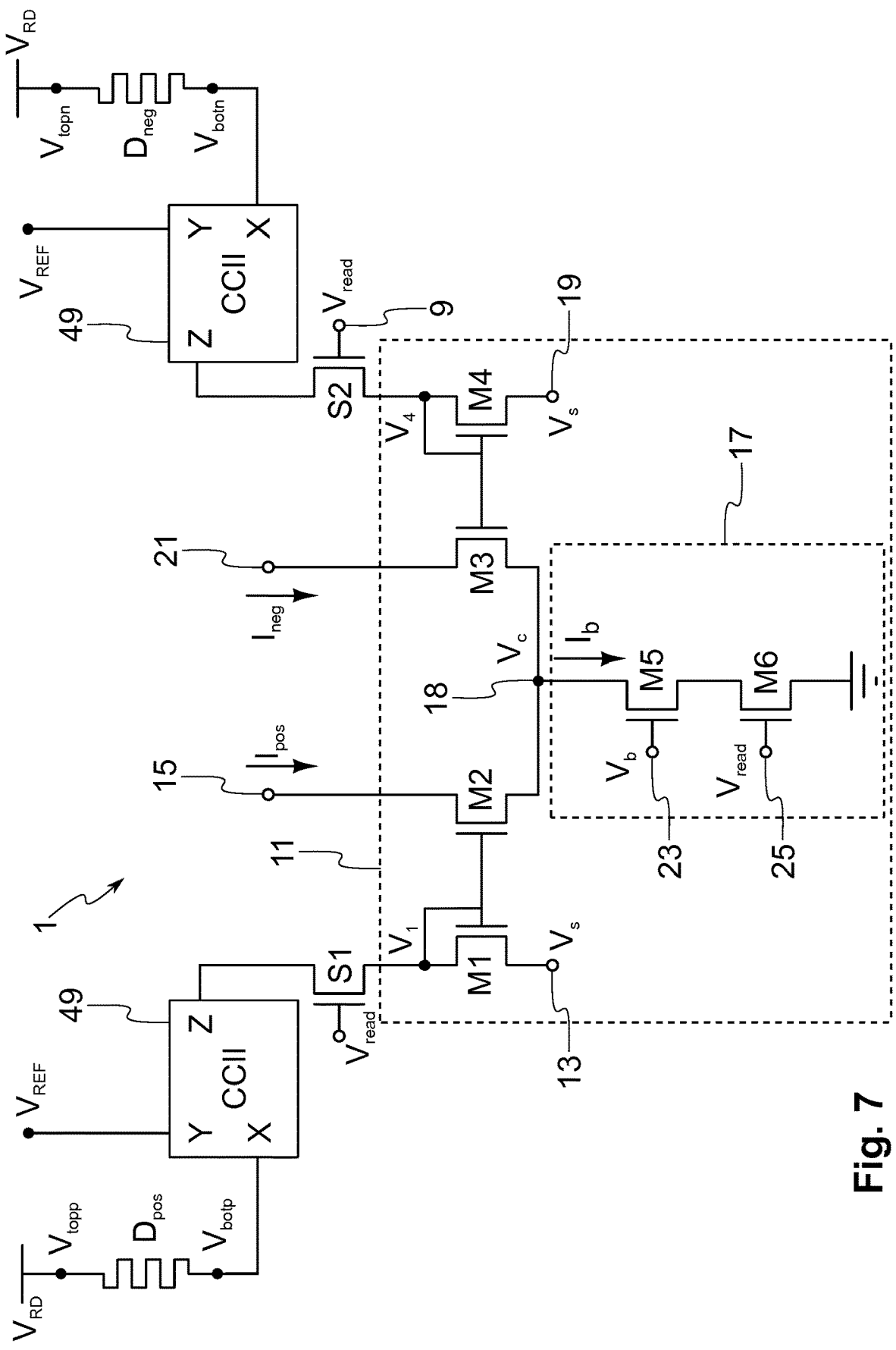
FIG. 7 is a schematic circuit diagram illustrating a second variant of the read mode part of the memristive circuit according to an example of the present invention.

In order to improve the linearity of the memristive circuit 27, it is possible to add one or more active components to the current-sensing branches of the differential memristive circuit 27. In this way, it is possible to clamp the voltages at the bottom terminals $V_{botx}$ of the memristive devices to a desired control voltage $V_{REF}$ and impose a linear transfer function of the type $I_x=I_{Mi}=(V_{RD}-V_{REF})/R_x$ (as opposed to the transfer function of Equation 5). Examples of circuits that use these active components are shown in FIGS. 6 and 7. FIG. 6 shows an operational amplifier 47 connected in a negative feedback loop to set the $V_{botx}$ node of the memristive device to a fixed voltage $V_{REF}$. This feedback arrangement ensures that the currents through the transistors M1, M4 are a linear function of the memristor conductance. This current is then normalised by the normaliser circuit 11. It is to be noted that the transistors M1 and M4 are not diode-connected (contrary to the configuration of FIG. 1). Thus, the normaliser circuit 11 of FIG. 6 does not comprise any current mirrors and scaling current mirrors. In other words, a current scaling operation is in this configuration achieved without the use of any current mirrors. The circuit shown in FIG. 7 does not use a feedback circuit to clamp the voltage at $V_{botx}$. Instead, it uses current conveyor circuits 49 to set the voltage at the $V_{botx}$. This ensures that the currents through the diode-connected transistors M1, M3 are a linear function of the memristive device conductance. It is to be noted that the current conveyors shown in FIG. 7 are circuits that force $I_Y=0$, copy voltage at node X to node Y, and set $I_Z$ to $I_X$. Similar functionality can also be achieved by other types of current conveyor circuits.

Figure 8:
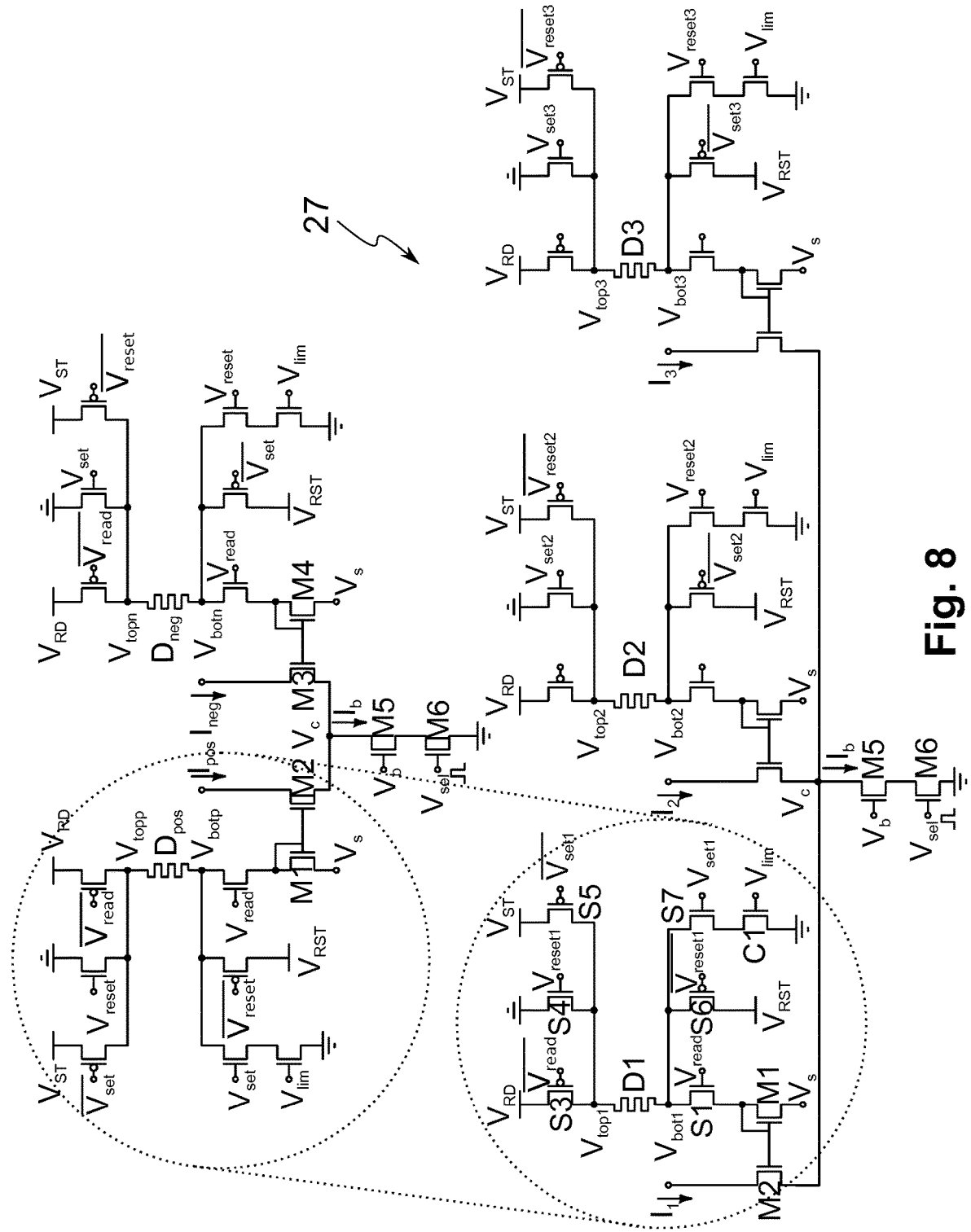
FIG. 8 is a schematic circuit diagram illustrating how to obtain a multi-device memory according to an example of the present invention.

FIG. 8 illustrates an example procedure for extending the memristive circuit 27 to include more than two memristive devices to obtain e.g. a multi-device memory block or cell. The extended circuit shown in FIG. 8 illustrates the concept for incorporating three memristive devices. Each memristive device branch comprises the transistor arrangement that is shown inside the dashed circles including also the scaling mirror configuration. In the example of FIG. 8, three branches corresponding to the memristive devices are connected to form one normaliser circuit arrangement. Each branch of the normaliser circuit generates an output current, denoted as $I_1$, $I_2$, and $I_3$ in the figure, which are approximately equal to:

$$I_1 \approx I_b \cdot \frac{G_1}{\sum_{x=1}^{3} G_x} \quad (8)$$

$$I_2 \approx I_b \cdot \frac{G_2}{\sum_{x=1}^{3} G_x}$$

$$I_3 \approx I_b \cdot \frac{G_3}{\sum_{x=1}^{3} G_x},$$

where $G_x$ is the conductance of a device $D_x$.

These currents can then be combined to create positive and negative output currents in various manners, depending on the application. For example $$I_{pos}=I_1+I_2 \quad (9)$$

$$I_{neg}=I_3. \quad (10)$$

Another possibility to expand the dynamic range of the output currents is to weigh (by using a weighing factor) the currents output from each branch or some of the branches as follows:

$$I_{pos}=I_1$$

$$I_{neg}=2 \cdot I_2+I_3. \quad (11)$$

It is to be noted that these ideas can be extended to multiple devices.

The read operation of the combined circuit is enabled when the $V_{sel}$, $V_{read}$ and $\overline{V_{read}}$ signals are set to logical 1, and 0, respectively. In this mode, the transistors S1 and S3 in each of the three branches shown in FIG. 8 are on, and the normaliser circuit generates an output given by Equations 8. The net or total output current can then again be obtained by the difference between $I_{pos}$ and $I_{neg}$.

As in the case of the two-device differential arrangement, programming the state of the devices $D_1$, $D_2$, $D_3$ in the configuration of FIG. 8 is achieved by setting the corresponding $V_{setx}$ and $V_{resetx}$ signals of the respective device branch to appropriate logical values. However, unlike the two-device differential case, the control circuitry for determining the $V_{setx}$ and $V_{resetx}$ signals is more complex. It would depend on the specific equations used to generate the output currents $I_{pos}$ and $I_{neg}$. For example, if Equation 9 is used, then increasing the synaptic weight can be achieved either by increasing $G_1$ or $G_2$ or both, while decreasing $G_3$. When two state memristive devices are used in this circuit, this arrangement allows implementation of multi-state memory devices.

Figure 9:
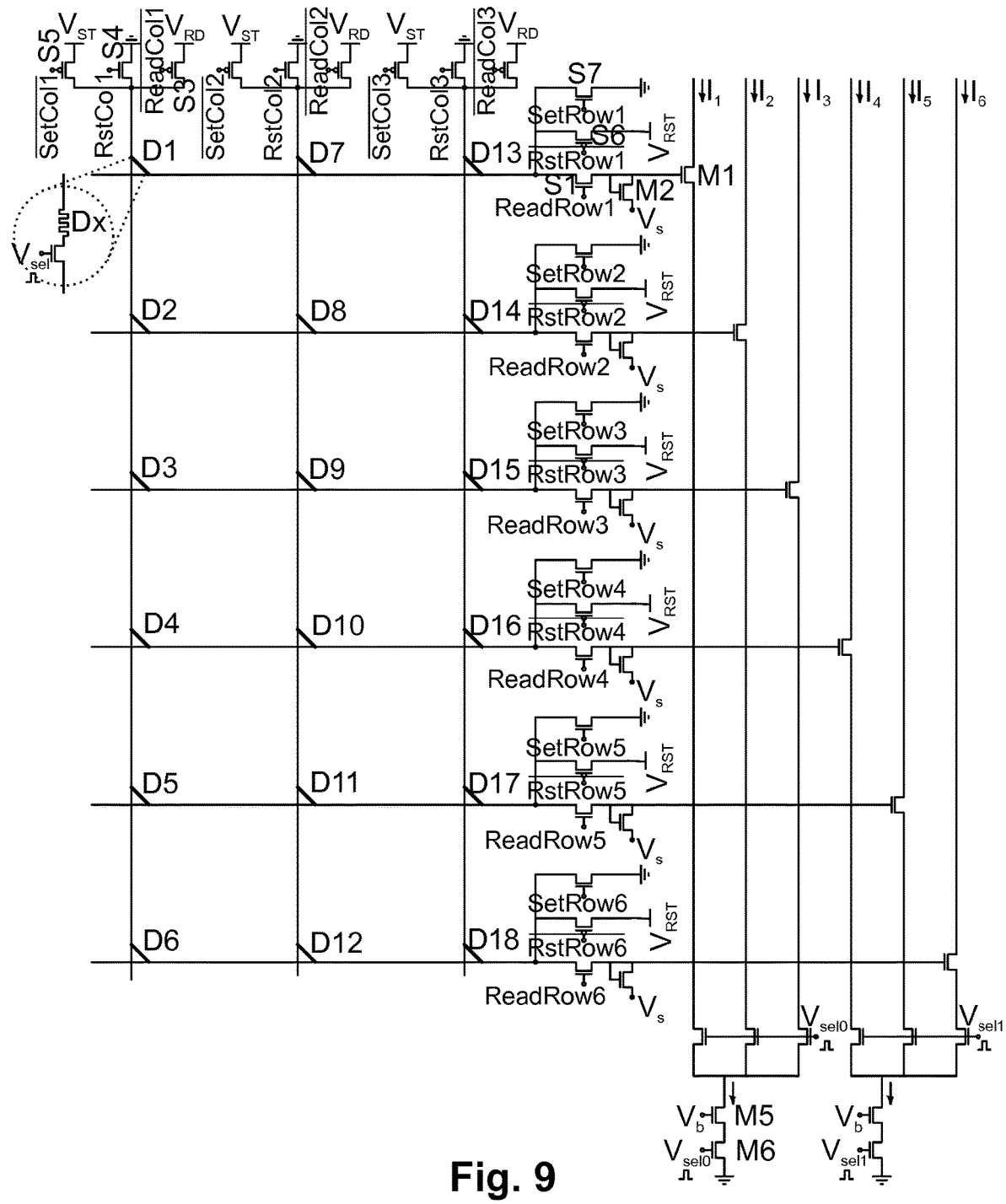
FIG. 9 is a schematic circuit diagram illustrating how the teachings of the present invention can be applied to a dense crossbar array according to an example of the present invention.

The multi-device memory cell can be integrated into a compact crossbar array arrangement in the manner illustrated in FIG. 9. The crossbar arrangement may be part of a synaptic circuit, which stores its weight as the difference between the conductances of two memristive devices, one representing a positive term and the other representing a negative term. In FIG. 9, each memristive device in the crossbar array is shown to be associated with a selector, which in this example is a transistor below a respective memristive device, that needs to be turned on to read from or write into the memristive device. This selector can also be implemented using a diode in some technologies. As shown in FIG. 9, the normaliser circuit of FIG. 8 can be divided into separate components, in a way to have simple transistor-resistor or resistor structures in a dense cross-bar array appropriately connected to the rest of the circuit on the side of the array. A single normaliser can only be used to sense a single pair of devices ($D_{pos}$ and $D_{neg}$) at a time. If multiple devices (i.e. more than two devices) drive currents into the normaliser, it creates multi-device memory units or cells. This may be desirable in some applications. However, for the two-memristor architecture shown in FIG. 1, the number of normaliser circuits required is equal to the number of devices that can be accessed in parallel. If only a single memory block is read at a time, a single normaliser will suffice for the entire array. It is explained next how the read and write operations described earlier can be incorporated into a crossbar memory array.

When the first column is read, a first set of memristive devices comprising devices numbered D1, D2 and D3 (forming a first memory cell) is read. The first set of memristive devices forms a configuration shown in FIG. 8. In parallel, a second set of memristive devices comprising devices D4, D5, and D6 (forming a second memory cell) is also read. It is to be noted that in this case, every column comprises two memory cells, each comprising three memristive devices. The proposed arrangement results in a more compact memory array because multiple memristive elements share circuit elements. That is, in this example all the memristive devices in a column share the switching transistors S3, S4 and S5. Similarly, all the memristive devices in a row share the switching transistors S1, S6, and S7. The two-normaliser circuit sub-portions shown in the figure are also shared by the entire array. Each normaliser sub-portion comprises the fifth and sixth normaliser transistors M5, M6. It is to be noted that every row and column has a similar arrangement of switching transistors at one of their terminals. In the following, these devices will be referred to as copies of the transistors.

When the first column containing the memristive devices D1, D2, and D3 are accessed (i.e. read), the paths enabled by the transistor S1, and its copies in each row, connect the memristive devices to the normaliser circuit. When the read signal for column 1 is enabled, the currents $I_1$, $I_2$, and $I_3$ generated by the normaliser circuit are proportional to the conductance of the devices D1, D2, and D3, respectively (and given by equations 8). Similarly, the currents $I_4$, $I_5$, and $I_6$ are normalised and are proportional to the conductance of the devices D4, D5, and D6, respectively.

When the second column is read, the switching transistors S3, S4, and S5, for the first column are turned off and their copies for the second column are turned on. The switching transistor S1, and its copies in each row remain turned on. This allows the normaliser circuits to serve the memristive devices in the second column.

The write mode operation in the arrangement of FIG. 9 is achieved by a controller that keeps track of how the memristive device conductances are to be increased or decreased. After the read operation is complete, the controller updates the state of the entire array in two phases. In the first phase, all those devices whose conductances need to be increased are programmed by enabling to corresponding SetColx and SetRowy signals. In the next phase, the devices whose conductances are to be decreased are programmed by programming the RstColx and RstRowy signals. The controller in this case is significantly more complex than in the two-device differential case. However, being a purely digital block that is shared by the entire array, it can be made reasonably compact.

Another application of the proposed circuit is its embedding in spike-based learning neuromorphic computing arrays. These architectures are typically designed using mixed-mode analogue/digital CMOS transistors and fabricated using standard very large-scale integration (VLSI) processes. Similar to the biological systems they model, these architectures process information using extremely energy-efficient methods that are asynchronous and event-driven. By adding on-chip learning circuits and adaptation circuits, the overall systems built this way can be adaptive, and fault-tolerant. A striking difference between neuromorphic systems and conventional information processing systems is in their use of memory structures: while conventional computing systems based on the classical von Neumann architecture have one or more central processing units physically separated from the main memory areas, neuromorphic architectures are characterised by co-localised memory and computation structures (such as the proposed differential memristive current-mode circuit), which can be used to emulate the properties of synapses in biological neural processing systems. Brain inspired neuromorphic information processing systems offer an attractive solution for implementing an alternative for non von Neumann computing paradigms, using advanced and emerging technologies. The reason for this is that memory-related constraints, such as size, access latency and throughput, represent one of the major performance bottlenecks in conventional computing architectures, and that the biological nervous systems can perform robust computations, using memory and computing elements that are slow, in-homogeneous, stochastic and faulty. Rather than attempting to reduce device mismatch effects of nanoscale devices, or to implement fault-tolerant circuits using brute-force engineering techniques at the circuit design level, these neuromorphic architectures can address these effects at the network level, with collective computation, adaptation, and feedback mechanisms. The circuit proposed here can be directly interfaced to spike-based learning neuromorphic circuits, which are intrinsically resistant to mismatch by design, and do not require precisely matched devices.

The availability of very dense and reliable resistive random-access memory (RRAM) devices can be exploited to implement very efficiently a main characteristic of neuromorphic systems: plasticity, and therefore, on-line learning capability. The circuit proposed here can be combined with efficient CMOS circuit techniques to allow for basic neural plasticity learning rules such as STDP, and variations of it.

While the invention has been illustrated and described in detail in the drawings and foregoing description, such illustration and description are to be considered illustrative or exemplary and not restrictive, the invention being not limited to the disclosed embodiment. Other embodiments and variants are understood, and can be achieved by those skilled in the art when carrying out the claimed invention, based on a study of the drawings, the disclosure and the appended claims. For example, instead of obtaining the net output current $I_{out}$ as the difference between $I_{pos}$ and $I_{neg}$, the net output current could be any mathematical combination of the two or more input currents. For example, the net output current cold be $I_{out} = I_{pos}/I_{neg}$.

In the claims, the word "comprising" does not exclude other elements or steps, and the indefinite article "a" or "an" does not exclude a plurality. The mere fact that different features are recited in mutually different dependent claims does not indicate that a combination of these features cannot be advantageously used. Any reference signs in the claims should not be construed as limiting the scope of the invention.

The invention claimed is:

1. A differential memristive circuit comprising:
    a normaliser circuit comprising a first normaliser circuit input node, a second normaliser circuit input node, a first normaliser circuit output node, and a second normaliser circuit output node, the normaliser circuit being configured to scale a first input signal and a second input signal to produce a first output signal and a second output signal, respectively;
    a first memristive element connected between a first circuit node and the first normaliser circuit input node, the first memristive element being characterised by a first adjustable resistance value;
    a second memristive element connected between a second circuit node and the second normaliser circuit input node, the second memristive element being characterised by a second adjustable resistance value; and
    a set of voltage sources configured to generate voltages greater than 0 V, the set of voltage sources being configured to generate a first voltage value across the first memristive element and a second voltage value across the second memristive element,
    wherein the first output signal depends on the first adjustable resistance value, while the second output signal depends on the second adjustable resistance value, and wherein a memristive circuit net output signal depends on the first output signal and the second output signal.

2. The differential memristive circuit according to claim 1, wherein the differential memristive circuit is a current-mode circuit where the first output signal is a first current output signal and the second output signal is a second current output signal.

3. The differential memristive circuit according to claim 1, wherein the normaliser circuit comprises a first scaling current mirror between the first normaliser circuit input node and the first normaliser circuit output node, and a second scaling current mirror between the second normaliser circuit input node and the second normaliser circuit output node.

4. The differential memristive circuit according to claim 3, wherein the first scaling mirror is connected to a first scaling current mirror voltage source configured to generate a voltage value greater than 0 V, while the second scaling mirror is connected to a second scaling current mirror voltage source configured to generate a voltage value greater than 0 V.

5. The differential memristive circuit according to claim 1, wherein the first circuit node is connected to a first switch circuit to selectively connect the first circuit node to a first voltage source, while the second circuit node is connected to a second switch circuit to selectively connect the second circuit node to a second voltage source.

6. The differential memristive circuit according to claim 1, wherein the first memristive element is connected to the first circuit node and to a third circuit node connected to a third switch circuit to selectively connect the third circuit node to a third voltage source, while the second memristive element is connected to the second circuit node and to a fourth circuit node connected to a fourth switch circuit to selectively connect the fourth circuit node to a fourth voltage source.

7. The differential memristive circuit according to claim 6, wherein the third switch circuit comprises a first current limiting element to limit current through the first memristive element, and the fourth switch circuit comprising a second current limiting element to limit current through the second memristive element.

8. The differential memristive circuit according to claim 1, wherein the first memristive element is connected to the first circuit node and to a third circuit node, while the second memristive element is connected to the second circuit node and to a fourth circuit node, and wherein the differential memristive circuit further comprises voltage clamping means for clamping the voltages at the third and fourth circuit nodes.

9. The differential memristive circuit according to claim 1, wherein the differential memristive circuit further comprises a first switch connected between the first memristive element and the first normaliser circuit input node, a second switch connected between the second memristive element and the second normaliser circuit input node.

10. The differential memristive circuit according to claim 1, wherein the differential memristive circuit further comprises a third memristive element connected between a fifth circuit node and a sixth circuit node, and wherein the fifth circuit node is connected to a fifth switch circuit, and the sixth circuit node is connected to a sixth switch circuit.

11. A memory cell comprising the differential memristive circuit according to claim 1.

12. A crossbar synaptic circuit comprising the memory cell according to claim 11.

13. The crossbar synaptic circuit according to claim 12, wherein the normaliser circuit is divided into at least a first sub-normaliser and a second sub-normaliser connected to each other through other circuit elements, and wherein the normaliser circuit is configured to serve more than one memory cell or one memory cell with more than two memristive elements.

14. A method of operating the differential memristive circuit according to claim 1, wherein the method comprises:
    determining states of the first and second memristive elements; and
    changing the states of the first and second memristive elements by selectively connecting the first and second memristive elements to voltage sources of the set of voltage sources.

15. The method according to claim 14, wherein the method comprises increasing the first adjustable resistance value while decreasing the second adjustable resistance value, or vice versa.

* * * * *